United States Patent [19]

Salfelder

[11] Patent Number: 5,451,290

[45] Date of Patent: Sep. 19, 1995

[54] GAS DISTRIBUTION SYSTEM

[75] Inventor: Joseph F. Salfelder, Campbell, Calif.

[73] Assignee: Applied Materials, Inc., Santa Clara, Calif.

[21] Appl. No.: 17,360

[22] Filed: Feb. 11, 1993

Related U.S. Application Data

[60] Continuation of Ser. No. 823,410, Jan. 21, 1992, abandoned, which is a division of Ser. No. 622,315, Feb. 7, 1990, abandoned, which is a continuation of Ser. No. 393,153, Aug. 14, 1989, abandoned.

[51] Int. Cl.$^6$ .............................................. H01L 21/00
[52] U.S. Cl. ...................................... 216/67; 156/345; 216/79
[58] Field of Search ........................ 156/643, 345, 662; 118/723

[56] References Cited

U.S. PATENT DOCUMENTS

| | | | |
|---|---|---|---|
| 4,134,817 | 1/1978 | Bourdon | 204/192 E |
| 4,209,357 | 6/1980 | Gorin et al. | 156/643 |
| 4,339,297 | 4/1981 | Aigo | 156/345 |
| 4,436,534 | 3/1984 | Bernacki et al. | 156/643 |
| 4,595,434 | 9/1986 | Giammarco et al. | 204/298 |
| 4,612,077 | 9/1986 | Tracy et al. | 156/345 |
| 4,617,079 | 10/1986 | Tracy et al. | 156/643 |
| 4,820,371 | 4/1989 | Rose | 156/345 |
| 4,838,990 | 7/1987 | Jucha et al. | 156/643 |
| 4,859,304 | 8/1989 | Cathey et al. | 204/298 |
| 4,931,135 | 6/1990 | Horiuchi et al. | 156/643 |
| 4,949,068 | 7/1990 | Davis et al. | 156/643 |
| 4,960,488 | 10/1990 | Law et al. | 156/643 |
| 5,006,520 | 4/1991 | Hijikata et al. | 204/298.33 |
| 5,009,738 | 4/1991 | Gruenwald et al. | 156/345 |

FOREIGN PATENT DOCUMENTS

| | | |
|---|---|---|
| 364215 | 4/1990 | European Pat. Off. |
| 61-163640 | 7/1986 | Japan |
| 61-208222 | 9/1986 | Japan |
| 63-142634 | 6/1988 | Japan |
| 63-303061 | 12/1988 | Japan |
| 305767 | 6/1989 | Japan |
| 01149964 | 6/1989 | Japan |

OTHER PUBLICATIONS

"Silicon Processing for the VLSI Era"—vol. 1—Process Technology—Wolf et al.; 201 1986; Lattice Press; Sunset Beach Calif.; ISBN 0-961672-3-7; pp. 550-551.
European Search Report.

*Primary Examiner*—R. Bruce Breneman
*Assistant Examiner*—George Goudreau
*Attorney, Agent, or Firm*—Birgit E. Morris; Peter J. Sgarbossa

[57] ABSTRACT

Improved apparatus and a method for reducing polymerparticle contamination of semiconductor wafers being processed in a system for plasma-etching silicon dioxide. A quartz gas distribution plate contains a number of gas inlet holes having cross-sectional areas sufficiently small to prevent plasma from being present in the gas inlet holes to inhibit formation of polymer material and flaking of contamination particles therefrom. The gas inlet holes are formed on the surface of the quartz gas distribution plate directly over a wafer being processed. Alternatively, the gas inlet holes are formed in the quartz plate to radially extend to the peripheral edge of the quartz plate so that contamination particles, if any, fall outside the bounds of a wafer beneath the quartz plate. The method disclosed includes the step of feeding $CHF_3$ gas through the gas inlet holes having cross-sectional areas sufficiently small to prevent formation of polymer within the holes and subsequent flaking and contamination of a wafer being processed.

15 Claims, 7 Drawing Sheets

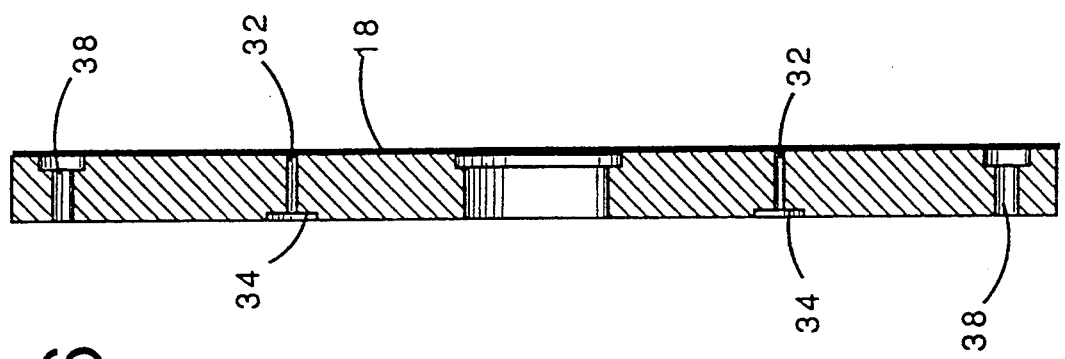
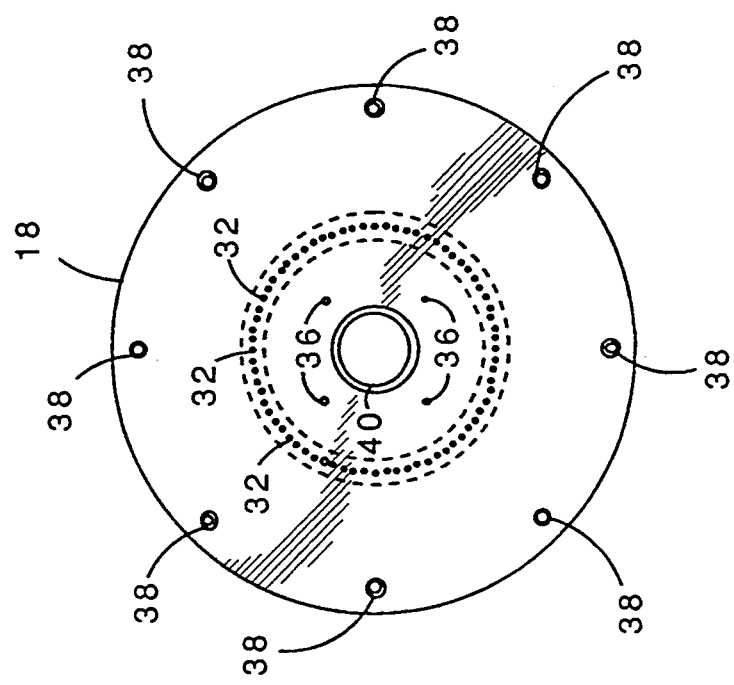
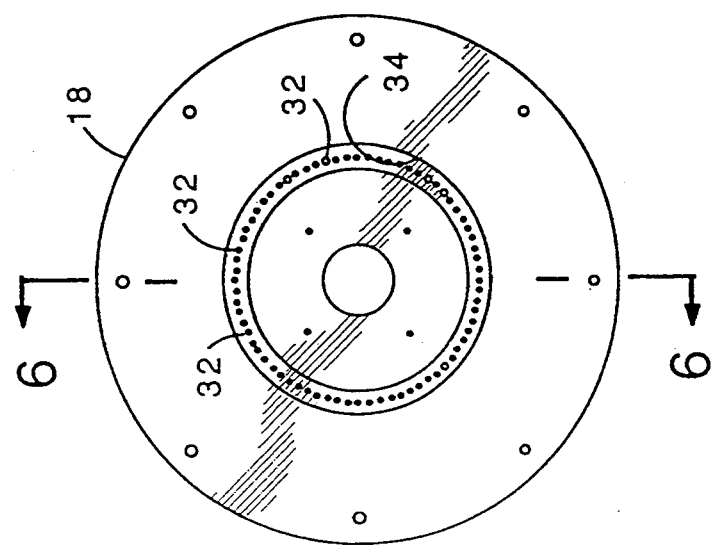

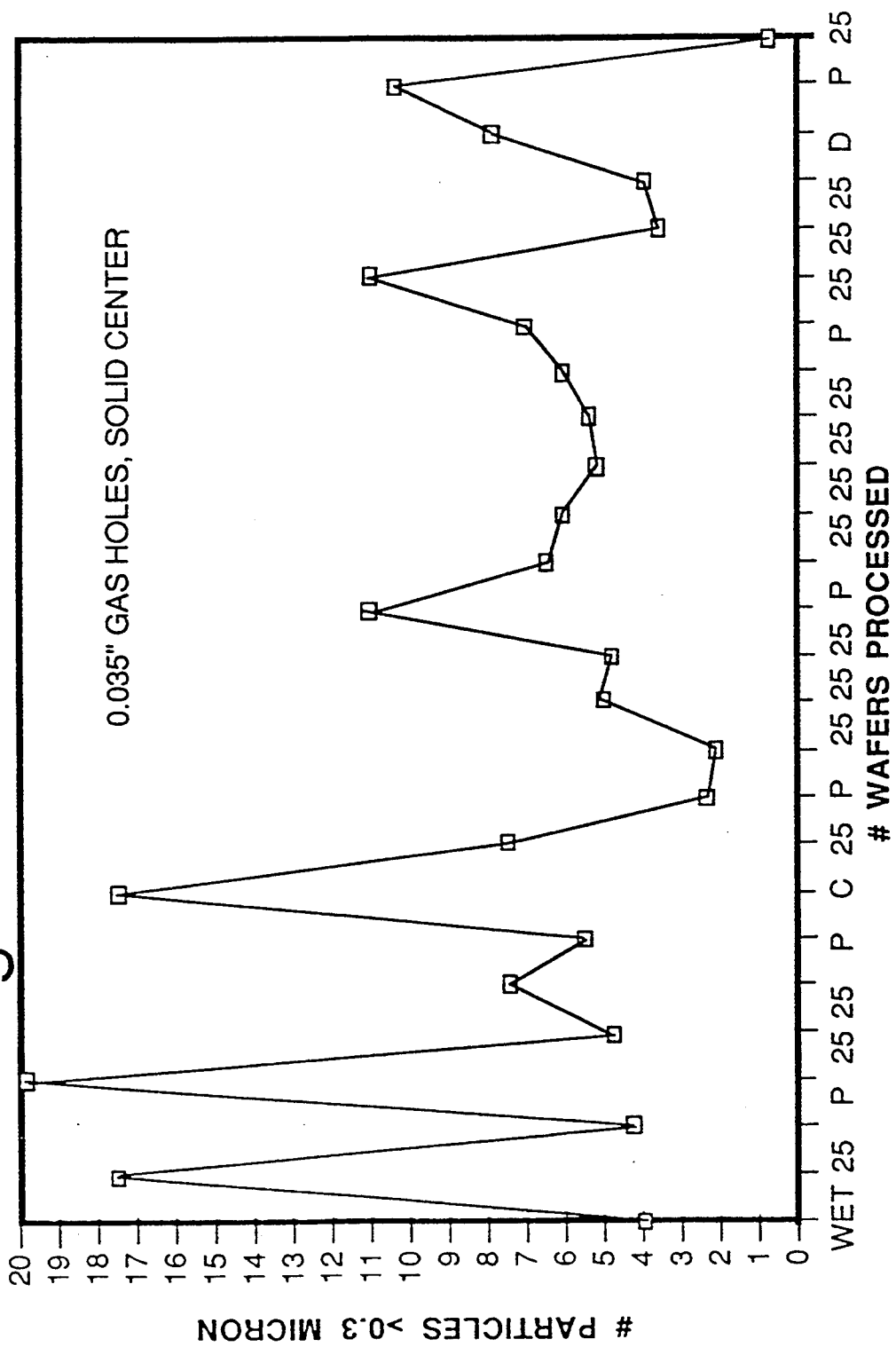

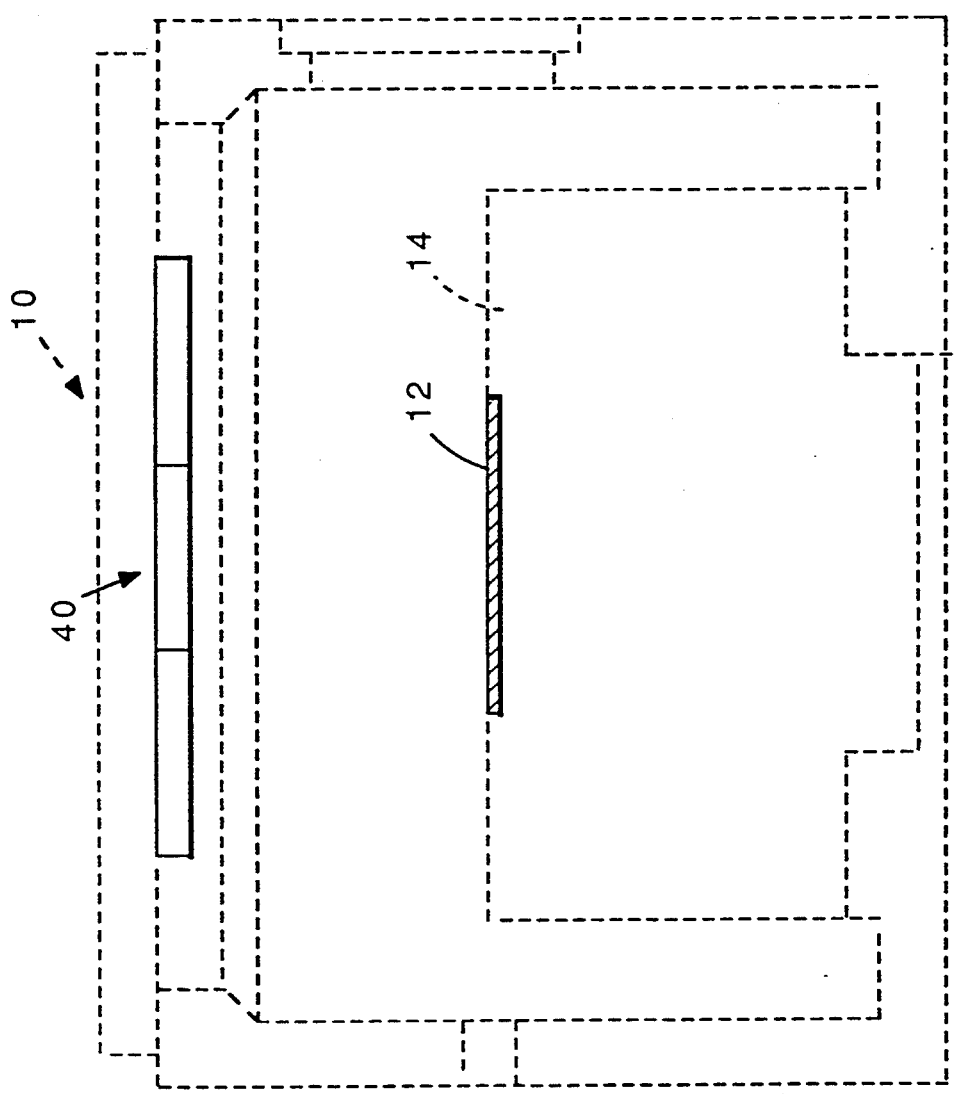

GAS DISTRIBUTION SYSTEM

This is a continuation of U.S. application Ser. No. 07/823,410 filed Jan. 21, 1992, now abandoned, which is a division of U.S. application Ser. No. 07/622,315 filed Dec. 7, 1990, now abandoned which is a continuation of U.S. application Ser. No. 07/393,153 filed Aug. 14, 1989, now abandoned.

BACKGROUND OF THE INVENTION

1. Field of the Invention

This invention relates to plasma etching equipment and, more particularly, to a gas distribution system for a plasma etcher.

2. Prior Art

Previously, plasma etching equipment used to etch thin oxide films in semiconductor devices have had problems with contamination of a semiconductor device by polymer particles. Thin layers of polymer materials are deposited over the interior surface of a reaction chamber. The polymers are produced as a result of the chemical reactions involved in the oxide etching process. Gases for the plasma etching process are injected into the reaction chamber through gas inlet holes in a gas distribution plate, which is positioned within the reaction chamber directly over a semiconductor wafer mounted on a cathode structure. A plasma is formed in the reaction chamber and the plasma may even extend through the gas inlet holes and into the gas supply manifold so that polymer material is formed within the gas inlet holes and even in the gas manifold. Particles of polymer material formed in the gas supply manifold and in the gas inlet holes of the gas distribution plate break off and fall on a semiconductor wafer being etched. These particles contaminate the wafers and, consequently, reduce the yield obtained from a wafer.

SUMMARY OF THE INVENTION

It is an object of the invention to provide apparatus and a method for reducing polymer particle contamination in a plasma etching process for silicon dioxide.

In accordance with these and other objects of the invention, an improved system, including an improved gas distribution plate, and an improved method for plasma-etching an oxide layer on a semiconductor wafer is provided. I have discovered that, by reducing the cross-sectional area of the gas inlet holes to a plasma-etching chamber to the point where plasma does not form within the gas inlet holes, it is possible to significantly reduce the amount of contamination caused by polymer particles falling on a semiconductor wafer in a plasma-assisted etching process for silicon dioxide. A particular plasma-assisted process for etching silicon dioxide uses $CHF_3$, Ar and $CF_4$ as input gases with the $CHF_3$ and $SiO_2$ producing polymers which coat the interior of the chamber. Deposition of this polymer within the gas inlet holes appears to promote flaking of polymer particles from the walls of the gas inlet holes. The particles drop on a wafer being processed to contaminate an electronic structure being formed thereupon.

The improved system includes a plasma chamber in which a semiconductor wafer is contained. The plasma chamber has a certain portion which performs a gas distribution function. It has a number of gas inlet holes formed therein for distributing gas into the plasma chamber. An important aspect of the invention is that the gas inlet holes are sized for a particular set of etching process parameters such that their cross-sectional area is sufficiently small to prevent plasma from forming therein. This inhibits formation of polymer material on the interior surfaces of the holes which eliminates subsequent flaking of contamination particles. A particular embodiment of the gas distributor having the holes less than a critical size is a quartz gas distribution plate. In one preferred embodiment of the invention, the holes are arranged to be equally spaced apart in a circular pattern with the quartz plate being positioned over a wafer to be processed. In an alternative preferred embodiment of the invention, a gas distribution plate member includes a number of radially extending channels, each of which terminate in a gas inlet hole to the chamber, with the gas inlet holes being located not above a wafer. This arrangement permits contamination particles, if any, from falling on a wafer. The channels terminate in holes which are located on the peripheral edge surface of a distribution plate. In one embodiment of the invention, I have found that gas inlet holes with diameters of 0.035 inches or less are preferred, with 0.020 being a preferred size that I have used.

The improved method according to the invention includes the step of feeding $CHF_3$, Ar, and $CF_4$ gas into a reaction chamber through a plurality of gas inlet holes which have a cross-section sufficiently small to prevent plasma from forming therein and from depositing polymer material on the interior surfaces of the gas inlet holes. The gas is fed through holes formed as described above in connection with the structural description of the aluminum and quartz plate. In one embodiment of the invention the reaction chamber is maintained at less than atmospheric pressure with the gas inlet holes preferably being less than 0.035 inches in diameter.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 4 is a top plan view of a gas distribution manifold plate.

FIG. 5 is a bottom plan view of the gas distribution manifold plate of FIG. 4.

FIG. 6 is a sectional view of the gas distribution manifold plate of FIG. 4, taken along section line 6—6 of FIG. 4—4.

FIG. 7B is a graph of the number of contamination particles versus the numbers of wafers processed in a plasma oxide-etching chamber according to the invention.

FIG. 8 is a cross-sectional view of an alternative embodiment of a plasma etching chamber according to the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
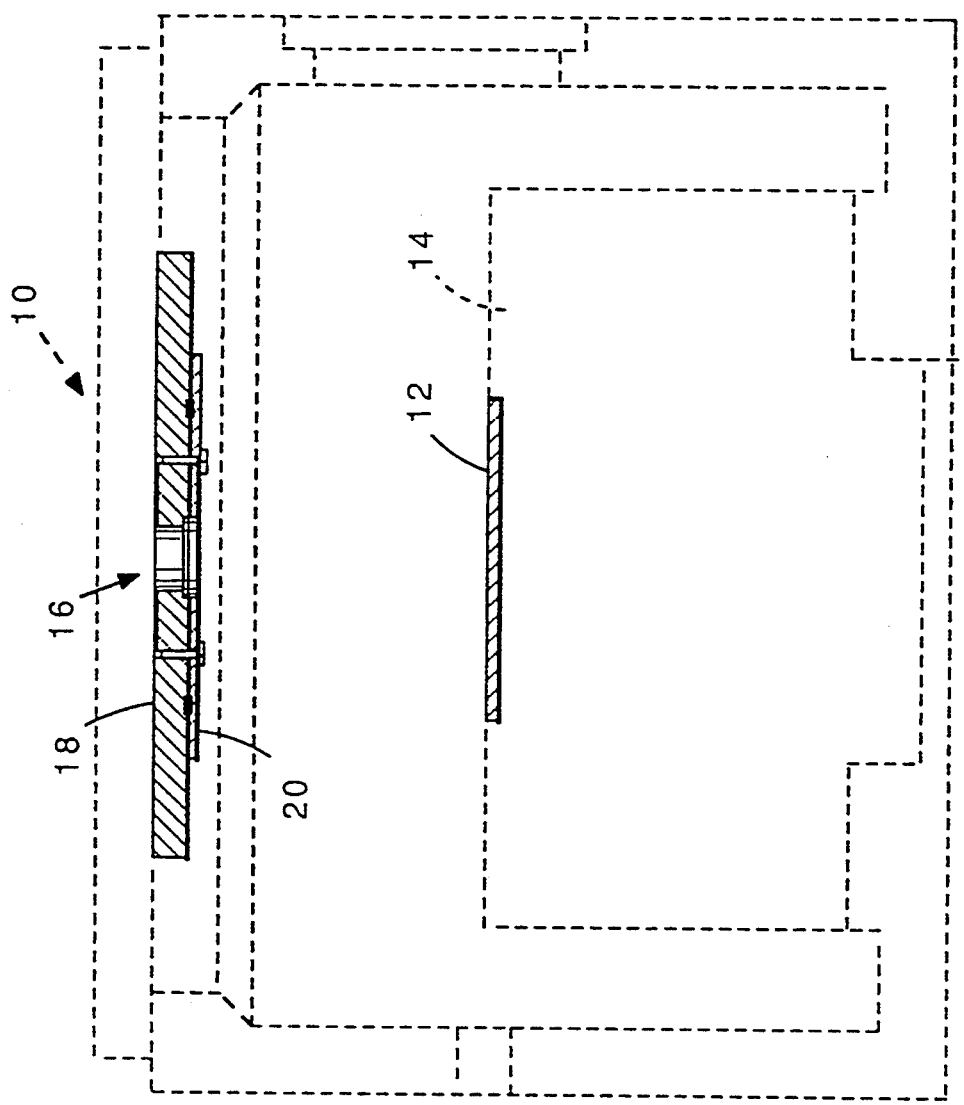
FIG. 1 is a cross-sectional view of a plasma-etching reaction chamber according to the invention.
Figure 3:
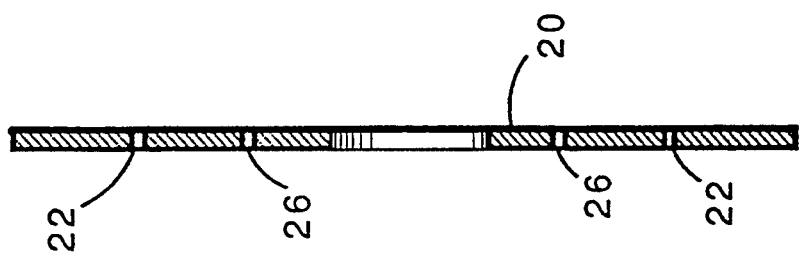
FIG. 3 is sectional view of a gas outlet plate taken along section line 3—3 of FIG. 2.

FIG. 1 shows a cylindrically-shaped plasma chamber 10 for containing a silicon semiconductor wafer 12 to be plasma-etched. The plasma chamber and the associated components described hereinbelow are incorporated into a low-pressure reactive-ion etching system with a magnetically-enhanced plasma which is produced by Applied Materials, Inc. of Santa Clara, Calif., as the Precision 5000 Etch System.

The wafer 12 is mounted on a cathode pedestal assembly 14. The top portion of the low-pressure chamber 10 includes a gas distribution structure 16 including a gas distribution manifold plate 18 and a quartz gas distribution plate 20 for delivering gases such as $CHF_3$ and Ar to the chamber for selective etching of silicon dioxide, as commonly required in the fabrication of semiconductor integrated circuit devices. The gas distribution manifold plate 18 and the quartz gas distribution plate 20 are mounted above the semiconductor wafer 12, as shown.

Figure 2:
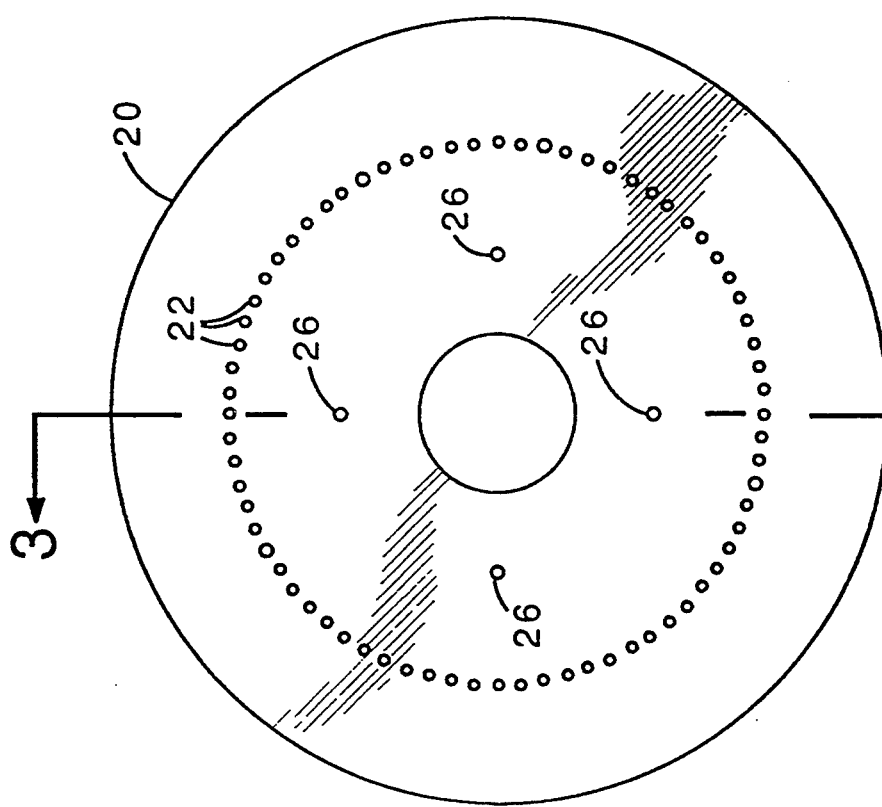
FIG. 2 is a plan view of a gas outlet plate according to the invention.

FIG. 2 shows a plan view of a thin quartz gas distribution plate 20. A plurality of equally-spaced gas inlet holes 22 (typically shown) are formed through the quartz plate 20. In prior art quartz distribution plates, gas inlet holes with diameters of 0.070 inches were used. However, it was found that plasma containing polymers, which are produced when $CHF_3$ reacts with $SiO_2$, tends to be coated onto the interior surfaces of the holes. During start-up of an etching cycle, the initial gas pressure tends to dislodge particles of polymer material which falls down onto the surface of the semiconductor wafer being etched and contaminates the wafer. In accordance with the invention, reducing the size of the holes prevents formation of plasma within the gas inlet holes and consequent deposition of polymer material on the interior surfaces defined by the holes. I have found that using 72 equally-spaced holes with a diameter of 0.035 inches or 0.020 inches provides reduction in particle contamination of semiconductors being processed. The gas distribution plate 20 also contains a large central aperture 24 and four holes 26 for mounting screws. The plate 20 is also hard anodized.

FIGS. 4, 5, and 6 shows the details of the gas distribution manifold plate 18. Corresponding to each of the gas inlet holes 22 of the quartz plate 20 are a corresponding number of gas through-holes (typically shown as 32). A circular channel 34 is formed in the top surface of the plate 18 to channel gases to the holes 32 and to the corresponding gas inlet holes 22 in the quartz plate 22. Four mounting-screw holes are provided in the plate 18 corresponding to the holes 26 in the quartz plate. Eight countersunk holes 38 are also provided for mounting the plate 18 to the top wall of the chamber 10 and a large central aperture 40 is also provided for access to plasma contained within the chamber. When assembled together, the plates 18,20 direct gases into the plasma chamber through the various gas inlet holes 22.

Figure 7A:
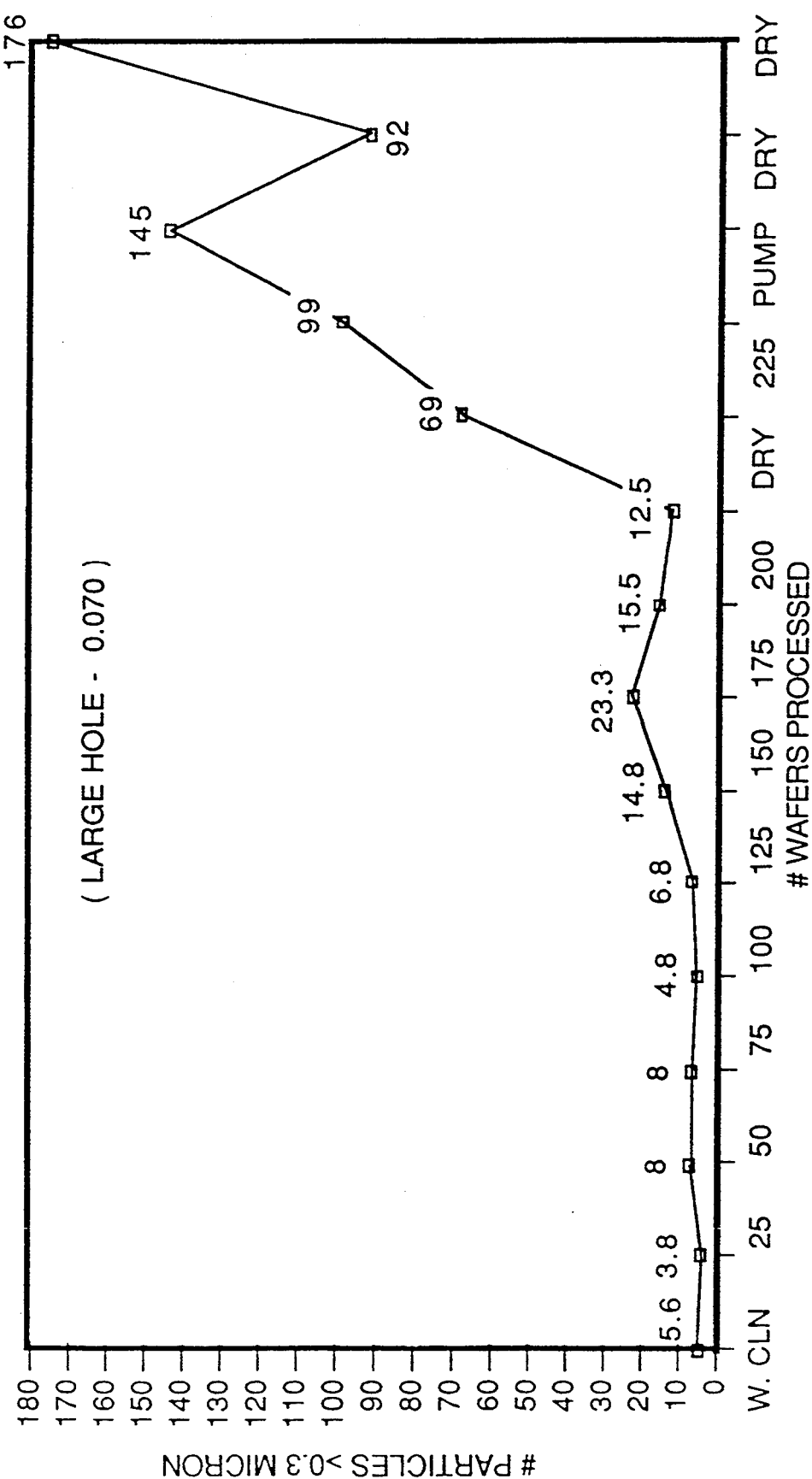
FIG. 7A is a graph of the number of contamination particles versus the number of wafers processed in a typical prior art plasma oxide-etching chamber.

FIG. 7A is a graph showing the number of particles greater than 0.5 microns as a function of the number of wafers processed through a plasma-etching chamber using the prior art gas inlet holes with a diameter of 0.070 inches. After 200 wafers, the number of particles exceeds 100. The full scale value for the number of particles is 180.

FIG. 7B is a graph showing the number of particles greater than 0.3 microns as a function of the number of wafers processed through a plasma-etching chamber having gas inlet holes of 0.035 inches. Note that the full scale value for the number of particles is 20. After 400 wafers, the number of particles is still less than 20, showing significant improvement over the prior art gas inlet holes. Note that examination of the holes and circular channel 34 of the gas manifold and of the holes 22 in the quartz plate according to the invention has showed no deposition of polymer material therein. It is believed that this absence of polymer formation accounts for the significant reduction in particles.

Figures 9, 10:
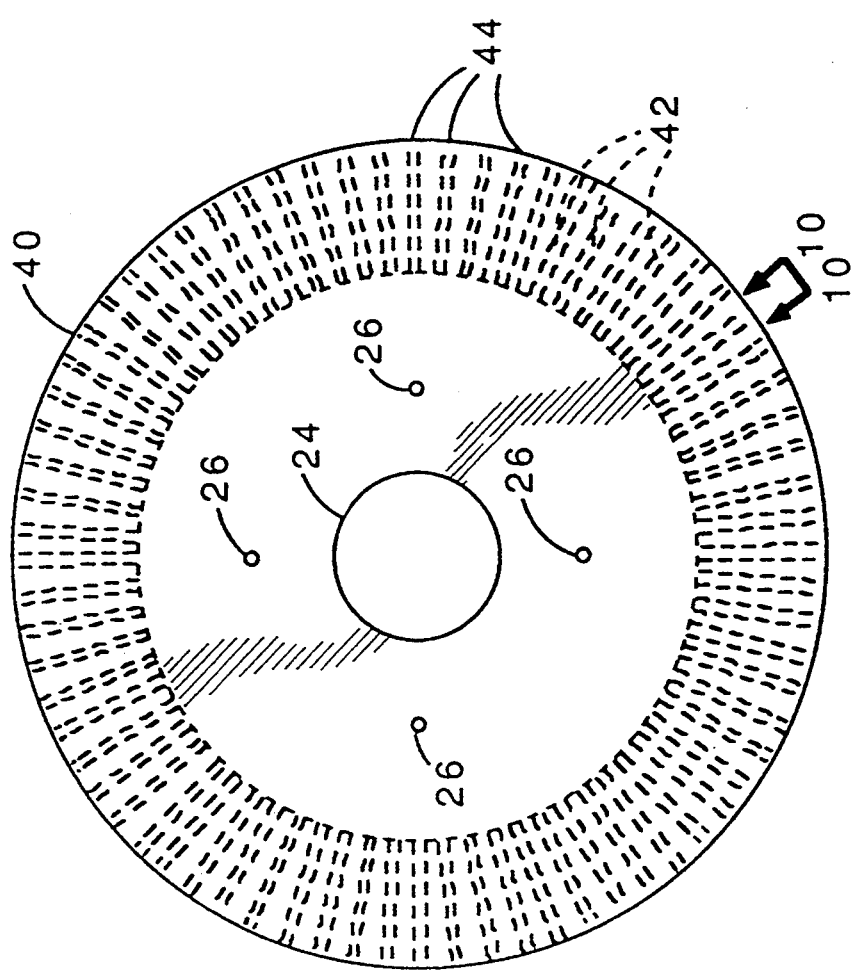
FIG. 9 is a plan view of a one-piece gas distribution plate according to the invention.
FIG. 10 is a cross-sectional view of the gas distribution plate if FIG. 9, taken along section line 10—10.

FIG. 8 shows another embodiment of the invention in which a gas manifold plate and a quartz distribution plate are combined together in a one-piece gas distribution plate 40. FIG. 9 shows that the plate 40 has a number of radially extending channels (typically shown as 42). For example, 72 channels are provided in the plate 40. FIG. 10 shows a cross-sectional view of the channel. The diameter of the channel is equal to or less than 0.035 with 0.020 being a typical value. FIG. 8 shows that the gas inlet holes 44 at the ends of the channels are located not above the wafer, but at a position located outside the wafer. If particles were to be formed they would fall to the side of the wafer and not contaminate the wafer itself.

In one specific embodiment of the invention, the following process parameters were used in an Applied Material, Inc. Precision 5000 Etch system: 650 watts of RF power; 60 Gauss of magnetic field; 60 sccm of Ar; 30 sccm of $CHF_3$; and 2 sccm of $CF_4$.

The foregoing descriptions of specific embodiments of the present invention have been presented for purposes of illustration and description. They are not intended to be exhaustive or to limit the invention to the precise forms disclosed, and obviously many modifications and variations are-possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A method of reducing polymer formation and particulates deposition on a substrate being etched by a plasma which comprises:

mounting said substrate on the cathode of a reactive ion etching chamber;

evacuating said chamber;

introducing a reactive precursor etch gas into said chamber from a showerhead gas distribution plate situate above said substrate, said plate having openings of such diameter so that plasma will not form in said openings and polymer will not form in said openings.

2. A method according to claim 1 wherein said openings have a maximum cross section of 0.035 inch.

3. A method according to claim 1 wherein said openings have a maximum cross section of 0.020 inch.

4. A method according to claim 1 wherein said precursor etch gas comprises $CHF_3$, $CF_4$ and argon.

5. A method according to claim 1 wherein said substrate is a silicon wafer.

6. A method according to claim 5 wherein said silicon wafer has a layer of silicon oxide thereon to be etched and said precursor etch gas comprises $CHF_3$, $CF_4$ and argon.

7. A method of reducing particulate formation in an etching chamber comprising a plasma precursor gas inlet, a gas distribution plate connected to said gas inlet having openings therethrough, a support for a substrate to be etched opposed to said gas distribution plate, and means for generating a plasma from said precursor gas in said chamber between said gas distribution plate and said substrate comprising limiting the diameter of said openings so as to prevent plasma from forming in said openings and thereby form a polymer in said openings that forms particulates during plasma processing.

8. A method according to claim 7 wherein the diameter of said openings is limited to 0.035 inch or less.

9. A method according to claim 7 wherein the diameter of said openings is limited to 0.020 inch or less.

10. A method according to claim 7 wherein the substrate is a silicon wafer having a layer of silicon oxide thereon.

11. A method according to claim 10 wherein the plasma precursor gas is an etchant gas mixture containing $CHF_3$.

12. A method according to claim 11 wherein the plasma precursor gas also contains $CF_4$ and argon.

13. A method according to claim 7 wherein said openings comprise radial channels formed through said plate and terminating about the peripheral edge of said plate and wherein said plate has a diameter larger than said substrate.

14. A method according to claim 13 wherein the diameter of said openings is 0.035 inch or less.

15. A method according to claim 13 wherein the diameter of said openings is 0.020 inch or less.

* * * * *